(12) United States Patent
Schredl et al.

(10) Patent No.: US 6,328,200 B1
(45) Date of Patent: Dec. 11, 2001

(54) PROCESS FOR SELECTIVE SOLDERING

(75) Inventors: Jürgen Schredl; Paul Kasulke, both of Berlin (DE)

(73) Assignee: PAC Tech - Packaging Technologies GmbH (DE)

( * ) Notice: Subject to any disclaimer, the term of this patent is extended or adjusted under 35 U.S.C. 154(b) by 0 days.

(21) Appl. No.: 09/254,381

(22) PCT Filed: Aug. 8, 1997

(86) PCT No.: PCT/DE97/01686

§ 371 Date: Feb. 26, 1999

§ 102(e) Date: Feb. 26, 1999

(87) PCT Pub. No.: WO98/09321

PCT Pub. Date: Mar. 5, 1998

(30) Foreign Application Priority Data

Aug. 27, 1996 (DE) .............................................. 196 34 646

(51) Int. Cl.[7] .................................................. B23K 31/02
(52) U.S. Cl. ................................. 228/248.1; 228/180.22; 228/225
(58) Field of Search ................................ 228/248.1, 245, 228/121, 122.1, 123.1, 178, 180.22, 180.21, 180.1, 179.1, 33, 35, 43, 254; 438/612, 613, 614, 615; 257/737, 738

(56) References Cited

U.S. PATENT DOCUMENTS

| | | |
|---|---|---|
| 3,516,155 | 6/1970 | Smith . |
| 4,436,806 * | 3/1984 | Rendulic et al. ...................... 430/311 |
| 4,906,823 * | 3/1990 | Kushima et al. ...................... 228/179 |
| 5,148,765 * | 9/1992 | Hung et al. ........................... 118/100 |
| 5,150,832 * | 9/1992 | Degani et al. ........................ 228/224 |
| 5,211,328 * | 5/1993 | Ameen et al. ....................... 228/180.2 |
| 5,388,327 | 2/1995 | Trabucco . |
| 5,389,497 * | 2/1995 | Yoshioka et al. ..................... 430/315 |
| 5,426,008 * | 6/1995 | Hagiwara et al. ...................... 430/18 |
| 5,492,266 | 2/1996 | Hoebener et al. . |
| 5,498,575 * | 3/1996 | Onishi et al. ......................... 437/209 |
| 5,499,756 * | 3/1996 | Banerji et al. ........................ 228/214 |
| 5,535,936 * | 7/1996 | Chong et al. ......................... 228/175 |
| 5,545,465 | 8/1996 | Gaynes et al. . |
| 5,586,715 * | 12/1996 | Schwiebert et al. .............. 228/248.1 |
| 5,762,259 * | 6/1998 | Hubacher et al. .............. 228/180.22 |
| 5,832,595 * | 11/1998 | Maruyama et al. .................. 29/829 |

FOREIGN PATENT DOCUMENTS

| | | |
|---|---|---|
| 38 18 864 C2 | 12/1998 | (DE) . |
| 0 173 188 A2 | 3/1986 | (EP) . |
| 0 586 243 A1 | 3/1994 | (EP) . |
| 0 609 861 A2 | 8/1994 | (EP) . |

OTHER PUBLICATIONS

Ogawa et al., Sep. 3, 1989, New Thick–Film Copper Paste for Ultra–Fine–Line Circuits, IEEE Transactions on Components, Hybrids, and Manufacturing Technology 12 (1989) Sep., No. 3, New York, US.

Ueda Shigeyuki, Aug. 19, 1994, Forming Method of Bump Electrode in Electronic Part, Patent Abstracts of Japan.

Ueda Shigeyuki, Sep. 22, 1994, Bump Forming Method, Patent Abstracts of Japan.

* cited by examiner

Primary Examiner—Tom Dunn
Assistant Examiner—Jonathan Johnson
(74) Attorney, Agent, or Firm—McGlew and Tuttle, P.C.

(57) ABSTRACT

Process for the selective formation of contact metallisations on terminal areas of a substrate, wherein the surface of the substrate is covered with a template in such a way that template openings forming deposit spaces are arranged above the terminal areas, and wherein the deposit spaces are filled with a solder material, and fusing of the solder material is effected with a view to forming the contact metallisations in the deposit spaces which are non-wettable at least in regions of contact with the solder material.

14 Claims, 3 Drawing Sheets

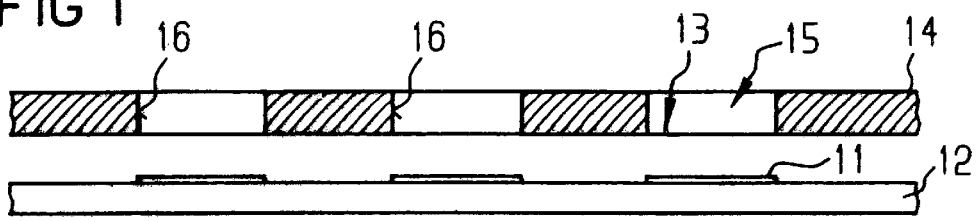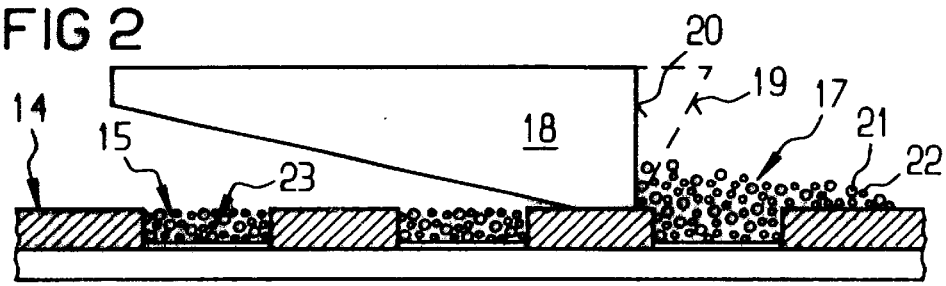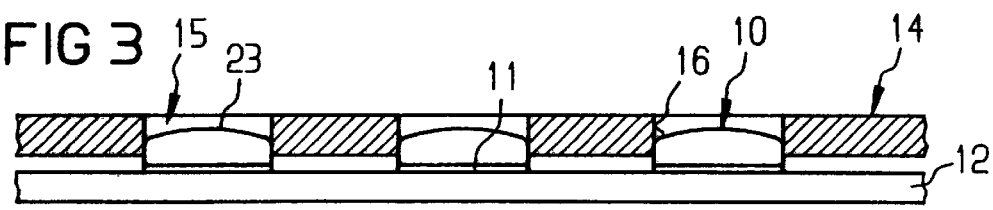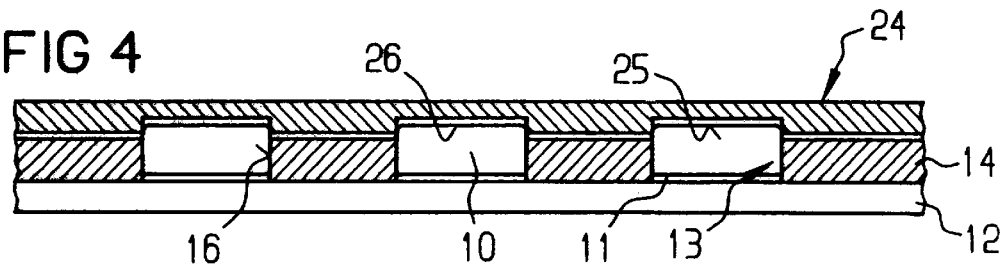

Figure 9:
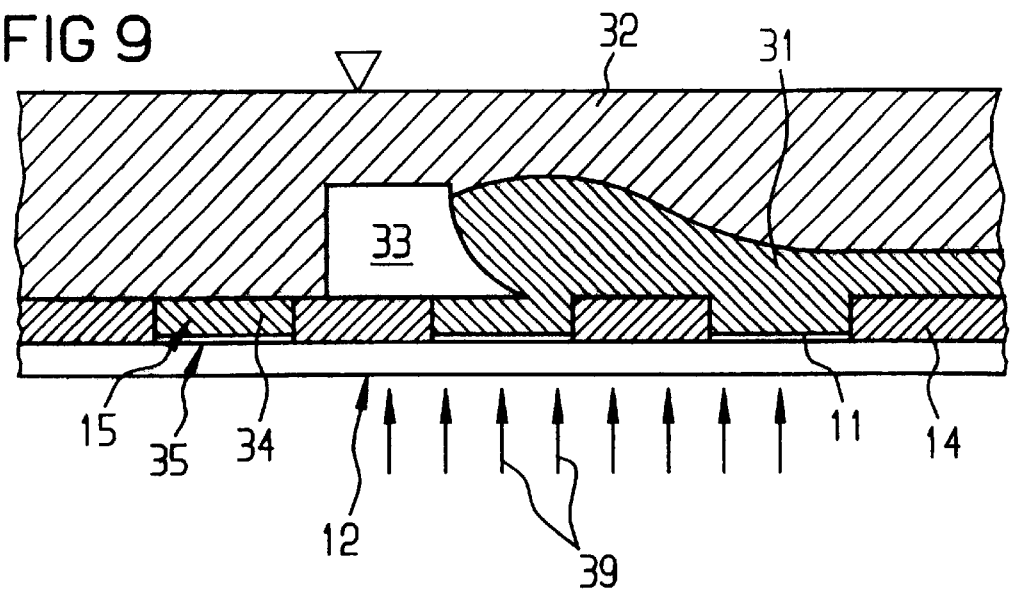

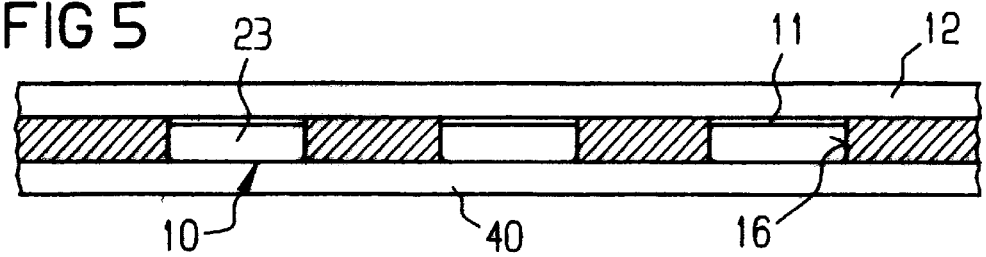
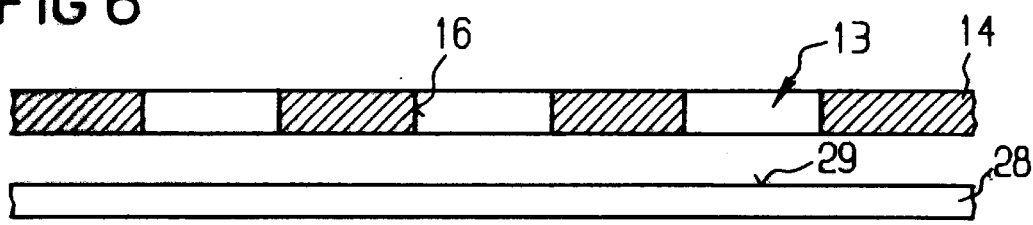
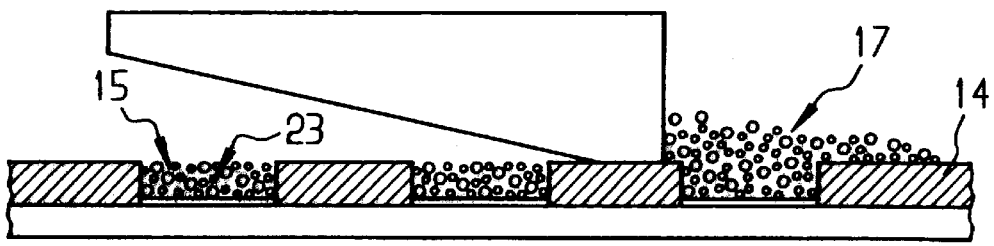
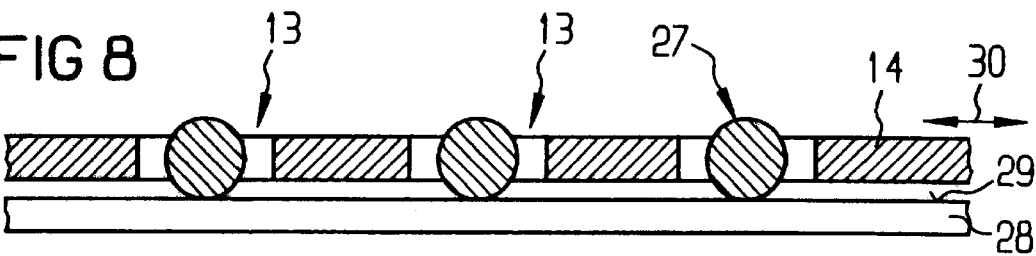

PROCESS FOR SELECTIVE SOLDERING

The present invention relates to the selective formation of mouldings of solder material on a substrate, wherein the surface of the substrate is covered with a template.

Template soldering processes are basically known in connection with the production of circuit boards that are used in SMD (Surface-Mounted Device) technology. The templates that are used in this technology serve, on the one hand, for positioning solder deposits at the desired points on the surface of the circuit board and, on the other hand, for defining the shape of the solder deposits via the template openings which are designed to correspond to the shape of the solder deposits. With a view to filling the deposit spaces pertaining to the template which are formed by the template openings, the solder material is frequently applied in pasty form onto the surface of the template and is filled into the deposit spaces by means of a suitable displacement device. After the deposit spaces have been filled with solder material the template is removed. Remelting of the solder deposits with a view to establishing an electrically conductive and mechanically secure connection of components on the circuit board is effected only after the appropriate components with their supply leads have been inserted into the still pasty solder deposits. In this process the shape of the remelted solder deposits is unimportant, as long as the aforementioned electrically conductive and mechanically secure connection is guaranteed.

In contrast with the aforementioned solder deposits that are mainly used in the field of SMD technology, raised contact metallisations, which are also known in technical language by the term "bumps" and which are formed from mouldings of solder material connected to terminal areas of a substrate, also perform a spacing function. Bumps, which serve as a rule for direct connection of components via the terminal areas thereof, exhibit to this end a raised formation projecting above the surface of the components. Performance of the spacing function furthermore presupposes a substantially unyielding formation of the bumps. Therefore, as distinct from solder deposits, bumps have already been remelted and solidified at the time of their contacting, whereas, as already explained above, the solder deposits are remelted only after the contacting process.

By reason of the spacing function explained above, particular importance is assumed by the shaping process in the course of the formation of bumps. With a view to the shaping of bumps it is known to utilise the liquid meniscus which forms in the melted state substantially independently of the solder material and which, as a result of the surface tension of the melted solder material, defines the shape in which the solder material solidifies after cooling. With the known processes for producing bumps that have a meniscus shape the solder material is applied in the already molten state onto the terminal areas to be wetted. This proves to be very cost-intensive, particularly with a plurality of terminal areas distributed over an area.

With other known processes for forming bumps on terminal areas of a substrate use is made of galvanic or chemical deposition processes which require the formation of an irrecoverable mask with mask openings above the terminal areas on the surface of the substrate. For instance, in the case of the galvanic deposition process it is conventional to arrange a mask, which is formed from a photoresist, on the surface of the substrate, the photoresist mask being pulled off after formation or deposition of the bumps on the terminal areas and thereby becoming unusable. Therefore with the known processes using masks or templates it is necessary to form a new template or mask for each substrate to be provided with contact metallisations.

The object underlying the present invention is to propose a process for the selective formation of mouldings of solder material on a substrate, said process enabling selective formation of the mouldings of solder material with comparatively little effort.

This object is achieved by means of a process having the features of Claim 1 or Claim 2.

With the process according to the invention as specified in Claim 1 for the selective formation of contact metallisations on terminal areas of a substrate, the surface of the substrate is covered with a template in such a manner that template openings forming deposit spaces are arranged above the terminal areas and subsequently the deposit spaces are filled with a solder material. The contact metallisations are formed from the fused solder material immediately afterwards, in the deposit spaces that inhibit wetting or that are non-wettable at least in regions of contact with the solder material.

With the process according to the invention the use of a template in the course of application of the solder material on the terminal areas and the fusing of the solder material which is filled into the deposit spaces when the template is still arranged on the surface of the substrate enable use to be made of solder material having a very largely arbitrary consistency, since the positioning of the solder material in relation to the individual terminal areas is defined by the template, at least for such time until, as a result of the formation of a liquid meniscus by the molten solder material on the wettable terminal areas, on the one hand an adhesion of the solder material on the terminal areas and, on the other hand, a dimensional stability of the contact metallisations is achieved. The non-wettable formation of the contact regions of the deposit spaces ensures that detachment of the template from the surface of the substrate is made possible already in the fused state of the contact metallisations or only after the solidification thereof, without it being possible for this to be impaired by an adhesion of the contact metallisations to the template.

In contrast with the "irrecoverable" templates that are used in the deposition processes described above, after it has been detached from the surface of the substrate the template that is used in the process according to the invention can be re-used in connection with the selective formation of contact metallisations on a subsequent substrate. Furthermore, detachment of the template after the contact metallisations have been fused enables immediate contacting of the substrate that is provided with contact metallisations in this manner, for example in the flip-chip process, without there being any need for a template, consisting for example of a photoresist lacquer, to be eliminated beforehand in elaborate manner by means of an etching process or such like. There are no particular restrictions as regards the template material, as long as the regions of contact with the solder material have a surface that inhibits wetting or that is non-wettable. This can also be effected by means of appropriate coatings in the contact regions. Rigid plastics are suitable in principle by way of template material, as are flexible films. Moreover, the use of semiconductor materials, for example, particularly the use of anisotropically etched semiconductors, is also possible.

Besides the process as set forth above for the selective formation of mouldings of solder material that are connected to terminal areas and designated here as contact metallisations, it is also possible for the idea of using a template for the application of solder material onto a substrate surface as a positioning aid during the fusing of the solder material to be applied to the formation of freely manageable mouldings of solder material that are not connected to terminal areas. With the further process according to the invention as specified in Claim 2, the surface of a substrate is covered with a template in such a manner that template openings forming deposit spaces are arranged above non-wettable deposit areas and the deposit spaces are filled with a solder material. Subsequently fusing of the solder material is effected with a view to forming the mouldings of solder material in the deposit spaces that inhibit wetting or that are non-wettable at least in regions of contact with the solder material.

The process that is an alternative to the subject of Claim 1 differs from the first process alternative merely in that, instead of the wettable substrate areas which in the case. of the first process variant are constituted by terminal areas, non-wettable substrate areas are provided. In corresponding manner both process variants make use of a template as a positioning aid in the course of the formation of mouldings of solder material by utilising the surface tension (meniscus effect) which obtains in the state of fusion of the solder material. In the case of the first process variant, as distinct from the second process variant, by virtue of the wettable formation of the substrate areas which are designed as terminal areas a connection is created between the mouldings of solder material and the terminal areas with a view to forming so-called bumps.

Irrespective of the choice of the two alternative process variants described above, the solder material can be filled into the deposit spaces in the form of a pasty or particulate material.

It is also particularly advantageous if the solder material takes the form of a mixture consisting of a liquid, organic medium and solder particles disposed therein. This type of composition of the solder material affords the particular advantage that, on the one hand, melting of the solder particles in a reducing or even inert atmosphere constituted by the liquid, organic medium is possible; on the other hand, by virtue of the specific wettability of a liquid, organic medium, particularly if it is a question of a medium with a long-chain molecular structure such as a polyalcohol for example, here in particular glycerin, the adhesion on a wettable substrate surface is improved.

Another possible way of generating a reducing or even inert atmosphere with minimal effort in the course of formation of the mouldings of solder material by fusing consists in applying the solder material in the form of a molten mass onto the surface of the template under the liquid level of an organic medium and in filling it into the deposit spaces. For filling the deposit spaces with molten solder material it proves to be advantageous in principle if the substrate is cooled in order to fill the deposit spaces. Irrespective of the nature of the solder material it proves to be advantageous if, with a view to filling the deposit spaces, the solder material is arranged on the surface of the template and is filled into the deposit spaces with a displacement device. The displacement device enables uniform filling of the deposit spaces.

Doctor knives or rollers may be employed as displacement device, in which connection, particularly when use is made of rollers, a particularly good and uniform filling of the deposit spaces has been demonstrated, which is substantially ascribed to the rolling motion composed of a superposition of a longitudinal motion of the roller axis on the surface of the template with the circumferential-motion component directed contrary to the longitudinal motion in the region of the substrate surface as a consequence of the rotation of the roller. By this means an entrainment effect of the solder material adhering at least partially to the roller is achieved contrary to the longitudinal motion of the roller.

With a view to influencing the shape of the mouldings of solder material which have been melted in the deposit spaces pertaining to the template it is possible, either prior to fusing of the mouldings of solder material or after conversion of the solder material into the state of fusion, to arrange a moulding plate on the surface of the template located opposite the substrate. By this means it is possible, for example, both for simple flattened regions on the mouldings of solder material and for profiles to be introduced into the upper side of the mouldings of solder material. Such profiles, which may be v-shaped for example, may then be used, for example, for simplified relative positioning of wire conductors in relation to the mouldings of solder material. This is advantageous in particular when positioning wire conductors on bumps prior to the contacting thereof.

Figure 10:
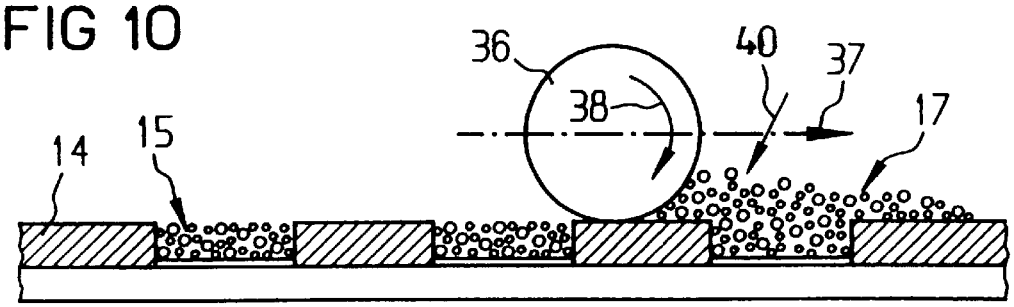
Figure 11:
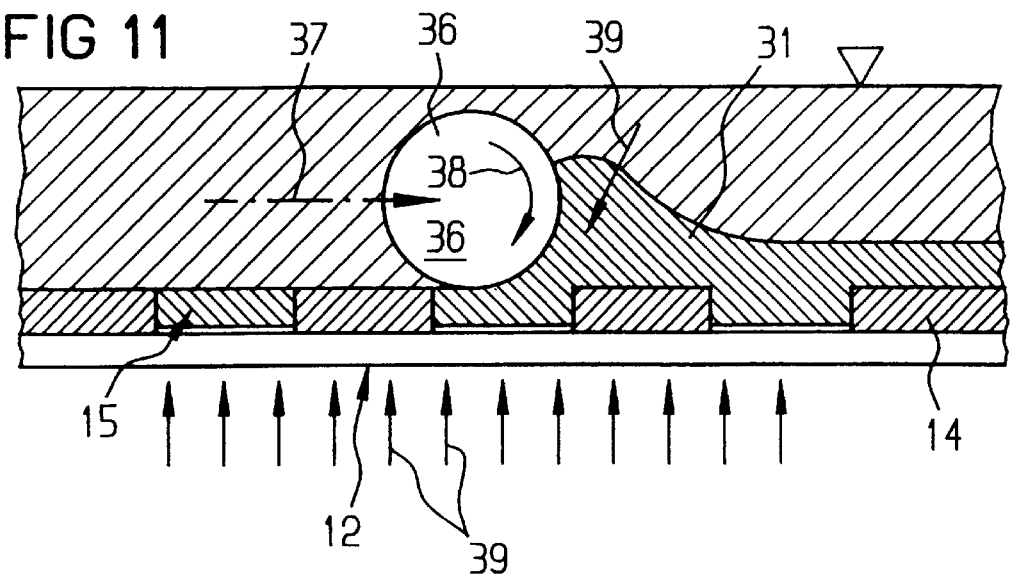

Examples of the process variants according to the invention are elucidated in more detail in the following on the basis of the drawings. Illustrated are:

FIG. 1 a substrate which is provided with terminal areas and covered with a template;

FIG. 2 the filling of deposit spaces pertaining to the template with solder material by means of a displacement device;

FIG. 3 the lift-off of the template after fusing of the solder material;

FIG. 4 a fusing of the solder material in deposit spaces pertaining to the template which are sealed by a die plate;

FIG. 5 a possible way of influencing the shape of the solder material;

FIG. 6 a substrate which is provided with a surface that is non-wettable or that inhibits wetting and which is covered with a template;

FIG. 7 the filling of the deposit spaces formed by template openings;

FIG. 8 the fusing of the solder material disposed in the deposit spaces;

FIG. 9 the filling of deposit spaces pertaining to a template with liquid solder material under glycerin;

FIG. 10 a representation corresponding to FIG. 2 with a different embodiment of the displacement device;

FIG. 11 a representation corresponding to FIG. 8 with a different embodiment of the displacement device.

FIG. 1 shows an initial phase in the course of the implementation of a process variant for forming raised contact metallisations 10 (FIG. 3), which in the following are designated in technical language as bumps, on terminal areas 11 of a substrate 12. The substrate 12 may be, for example, a chip or a wafer. In principle it holds true that the process elucidated in the following on the basis of differing process variants can always be applied when it is a matter of the selective soldering of arbitrarily distributed terminal areas on a substrate of arbitrary form.

In the initial phase represented in FIG. 1 a template 14 provided with template openings 13 is arranged on the surface of the substrate 12 in such a manner that the terminal areas 11 and the template openings 13 are assigned to one another in positions of registration. At the same time the template openings 13 form deposit spaces 15 which are terminated in the downward direction by the terminal areas 11 (see also FIG. 2). In contrast with the terminal areas 11 which have a wettable surface, the template openings 13 are provided with walls 16 that are of non-wettable or at least wetting-inhibiting construction. To this end the walls 16 may, for example, take the form of non-wettable coatings.

FIG. 2 shows how a metered filling of the deposit spaces 15 is effected after arrangement of the template 14 on the surface of the substrate 12 and subsequent planar arrangement of solder material 17 on the surface of the template 14 by means of a displacement device which here takes the form of a doctor knife 18. In the configuration represented in FIG. 2 by a continuous line contour the doctor knife 18 serves primarily to level the solder material 17 disposed in the deposit spaces 15 with the surface of the template 14. Consequently the amount of solder material that is provided with a view to producing a bump 10 (FIG. 3) can be defined exactly by appropriate dimensioning of the template openings 13 or of the deposit spaces 15. With the varied configuration of the doctor knife 18 represented by a dashed line contour, which has a compression face 19 inclined towards the surface of the template 14 instead of a front face 20 arranged substantially perpendicular to the surface of the template 14, a compression of an amount of solder material 23 received in the deposit spaces 15 can be effected simultaneously with the levelling elucidated above. The extent of the compression in this case is substantially dependent on the consistency of the solder material 17.

In the case of the solder material 17 which is represented by way of example in FIG. 2 it is a question of a particulate solder material which, in addition to metallic alloy particles 21, comprises flux particles 22. However, it is also equally possible to make use of a solder material that comprises alloy particles 21 disposed in a liquid, organic medium, preferably in a polyalcohol such as glycerin, for example. In this case the liquid medium then performs the function of the flux, but without inconvenient flux residues remaining behind after the fusing or remelting process, as is the case with the use of a flux, since the liquid medium and the alloy particles can be matched to one another with respect to their melting behaviour in such a way that the liquid medium substantially volatilises totally in the course of fusing.

FIG. 3 shows a process phase after fusing of the amounts of solder material 23 disposed in the deposit spaces 15 with a view to producing the bumps 10. In order to position the amounts of solder material 23 exactly with respect to the terminal areas 11 during the fusing process in the transition from the solid phase into the liquid phase, the template 14 remains on the surface of the substrate 12 during the fusing process and is only removed from the surface of the substrate 12 when the bumps 10 have assumed their stable, meniscus-shaped form. In this process the bumps 10 may still be in the liquid state or, after appropriate cooling, already in the solid state. If the template 14 which is provided with the non-wettable or the wetting-inhibiting walls 16 is already detached from the substrate when the bumps 10 are in the fused, still molten state, an unhindered solidification of the bumps in their typical meniscus shape can take place. If the template 14 remains on the surface of the substrate 12 until the bumps 10 have solidified and is only detached from the substrate 12 subsequently, the template 14 may also, via its walls 16, act as a forming tool on the external form of the bumps 10.

FIG. 4 shows an example of the template 14 remaining on the substrate 12 during the solidification of the bumps 10, whereby, in addition to the further influence on the shape of the bumps 10, the template 14 is covered by a moulding plate 24. In contrast with the template 14, the moulding plate 24 does not have uninterrupted openings but has shaping recesses 25 which, like the template openings 13 pertaining to the template 14, are provided with a wetting-inhibiting or non-wettable wall 26. As FIG. 4 further shows, the shaping recesses 25 pertaining to the moulding plate 24 are arranged to be coincident with the template openings 13 pertaining to the template 14. As a result, in the molten state of the bumps 10 it is possible for the shape thereof to be influenced in such way that the bumps 10 finally solidify in a flattened shape which is provided with a substantially plane surface.

FIG. 5 shows another possible way of influencing the shape of bumps 10 that are produced as a result of the solidification of the solder material 17 in the deposit spaces 15. To this end, starting from the configuration represented in FIG. 3 with the amount of solder material which is disposed in the deposit spaces 15, which is fused and which wets the terminal areas 11, the substrate together with the template 14 arranged thereon is turned over and, with the filled deposit spaces 15 pointing downwards, applied onto a counter-plate 40 that is provided with a wetting-inhibiting or non-wettable surface, using so-called "face-down" technology. In the process the flattened regions represented in FIG. 5 appear when the bumps 10 are still molten, so that the bumps 10 finally solidify in a flattened shape which is provided with a substantially plane surface. In a manner deviating from the representation according to FIG. 5 the template 14 may also be removed prior to application of the still molten amounts of solder material 23 onto the counter-plate 40. In the case represented in FIG. 5 the walls 16 of the deposit spaces 15 which are formed in the template may in addition contribute to the shaping of the bumps 10.

As becomes clear from the terminal areas 11 of the substrate 12 which here, by way of example, are of differing dimensions, it is possible for the process described with reference to FIGS. 1 to 5 to be employed advantageously particularly when it is a matter of providing terminal areas 11 of differing size with bumps 10 of correspondingly differing dimensions. In the case of the processes represented by way of example in FIGS. 1 to 5 with respect to the processing sequence it is merely necessary—as is clearly evident from the Figures—to dimension the template openings 13 pertaining to the template 14 or the shaping recesses 25 pertaining to the moulding plate 24 correspondingly. Moreover, it also becomes clear in particular from FIG. 4 that arbitrary profiles of the bumps 10 are possible by using a moulding plate 24 having appropriate shaping recesses and by using the template 14.

In FIGS. 6 to 8 an alternative to the process elucidated on the basis of FIGS. 1 to 3 is represented which, however, in a manner deviating from the processes represented in FIGS. 1 to 3, does not relate to the formation of mouldings of solder material that are connected to terminal areas—that is to say, bumps 10—but rather to the formation of arbitrarily manageable mouldings of solder material 27 (FIG. 8). As becomes clear from a comparison of FIGS. 1 to 3 with FIGS. 6 to 8, the alternative process represented in FIGS. 6 to 8 differs from the previously elucidated process substantially in that, instead of a substrate 12 with wettable terminal areas 11, use is made of a substrate 28 either with a surface 29 that is of non-wettable or wetting-inhibiting construction as a whole or with a surface 29 that is of wetting-inhibiting or non-wettable construction at least in the surface regions assigned to template openings 13 pertaining to the template 14.

The processing sequence beginning with the arrangement of the template 14, which in the present embodiment example is identical with the template 14 elucidated with reference to FIG. 1 and is likewise provided with wetting-inhibiting or non-wettable walls 16 pertaining to the template openings 13, is identical with the processing sequence represented in FIGS. 1 to 3. In order to assist the formation of the mouldings of solder material 27 from the amounts of solder material 23 disposed in the deposit spaces 15 by fusing so as to result in an at least ball-like form, as represented in FIG. 8, the template 14 can be moved in any direction parallel to the surface 29, as indicated by the arrow 30. As a result, starting from the liquid meniscus produced by the surface tension of the fused, molten mouldings of solder material 27 in the transition to the state of solidification of the mouldings of solder material 27 together with a rolling of the mouldings of solder material 27 along the surface 29 of the substrate 28, the formation of a spherical shape is assisted.

In particular for the process variant represented in FIGS. 6 to 8, which serves for the formation of freely manageable mouldings of solder material 27, it is advantageous to use, instead of a conventional flux, a solder material 17 comprising a proportion of polyalcohol, for example a proportion of glycerine, in order to produce as high a surface tension as possible on the still molten moulding of solder material 27, assisting the formation of the spherical shape.

As further becomes clear from FIG. 8, by virtue of the positioning effect of the template 14 the solidified mouldings of solder material 27 are separated and arranged in defined manner with respect to their position, so that, for example, a selective removal of the mouldings of solder material 27 from the template openings 13 is possible, or a substrate provided with terminal areas, for example a chip, can be lowered, with its terminal areas, from above onto the mouldings of solder material 27 in the flip-chip process in order to produce bumps on the terminal areas of the chip as a result of a further remelting operation.

FIG. 9 shows a variant with respect to the filling of the deposit spaces 15 in the template 14. With a view to filling, use is made here of an already molten solder material 31 which is shielded from the environment during the filling process by means of a liquid, organic medium 32, for example glycerin. Conforming to the variants represented in FIGS. 2 and 7, use is made here of a displacement device taking the form of a doctor knife 33 for the definition of amounts of solder material 34 received in the deposit spaces 15. If, for example, cooling of the amounts of solder material 34 received in the deposit spaces 15 is effected via the displacement device 33 and/or the substrate 12, without further forming tools a solidification of the amounts of solder material 34 can take place so as to form disc-shaped mouldings of solder material or, as is the case in FIG. 9 on account of the use of a substrate 12 having wettable terminal areas 11, so as to form bumps 35 of discoid form. Irrespective of whether the variant represented in FIG. 9 serves for the production of freely manageable mouldings of solder material or for the production of bumps 35, fusing of the amounts of solder material 34 following the filling of the deposit spaces 15 can be dispensed with.

In order to simplify the filling of the deposit spaces 15 with the initially molten solder material and to prevent a de-wetting of the solder material from the terminal areas 11, during the filling of the deposit spaces 15 the substrate 12 is cooled from the side located opposite the terminal areas 11, as indicated by the arrows 39 in FIG. 9 [sic].

FIGS. 10 and 11 show, by way of example, the use of a displacement device which, differing from the representations according to FIGS. 2, 7 and 9, takes the form of a roller 36. The roller 36 may, as represented in FIG. 10, be used both for filling the deposit spaces 15 with solder material 17 which is initially in particulate or pasty form and, as represented in FIG. 11, for filling the deposit spaces 15 with already melted solder material 31. In both cases the rolling motion offers the advantage that, by virtue of the superposition of the longitudinal motion 37 of the roller with the rotation 38, a compression effect, indicated in its direction of action by the arrow 40, is achieved with a view to better filling of the deposit spaces 15. As already explained with reference to FIG. 9, cooling of the substrate 12 (arrows 39) may also be effected in the course of filling the deposit spaces 15 as represented in FIG. 11.

What is claimed is:

1. A process for selective formation of a contact metallisation, the process comprising the steps of:
    providing a substrate with a terminal area,
    providing a template defining a deposit space for receiving solder material, said deposit space having one of a wetting inhibiting and a non-wettable surface;
    placing said template on said substrate to position said deposit space over said terminal area;
    filling said deposit space with solder material including applying said solder material to said template in a molten mass under a liquid level of an organic medium;
    fusing said solder material in said deposit space over said terminal area to form the contact metallisation.

2. The process in accordance with claim 1 wherein:
    said substrate includes a plurality of said terminal areas;
    said template includes a plurality of said deposit spaces;
    said one of a wetting inhibiting and a non-wettable surface is in contact with said solder material in said deposit spaces;
    said fusing forms a plurality of contact metallisations providing another substrate with a terminal area;
    placing said template on said another substrate to position said deposit space over said terminal area of said another substrate.

3. The process in accordance with claim 1, wherein:
    said solder material is filled into said deposit space in a form of one of a pasty and particulate material.

4. The process in accordance with claim 1, wherein:
    said solder material takes a form of a mixture of a liquid, an organic medium and solder particles.

5. The process in accordance with claim 1, wherein:
    said filling of said solder material into said deposit space includes applying said solder material to said template in a molten mass under a liquid level of an organic medium.

6. The process in accordance with claim 5, wherein:
    said filling of said solder material includes cooling said substrate to promote said filling.

7. The process in accordance with claim 1, wherein:
    said filling of said solder material includes arranging said solder material on a surface of said template and displacing said solder material using a displacement device.

8. A process for selective formation of a molding of solder, the process comprising the steps of:
    providing a substrate with one of a wetting inhibiting and a non-wettable substrate surface;
    providing a template defining a deposit space for receiving solder material, said deposit space having one of a wetting inhibiting and a non-wettable surface;
    placing said template on said substrate to position said deposit space over said substrate surface;
    filling said deposit space with solder material including applying said solder material to said template in a molten mass under a liquid level of an organic medium;
    fusing said solder material in said deposit space over said substrate surface to form the molding of solder.

9. The process in accordance with claim 8, wherein:

said substrate includes a plurality of said terminal areas;

said template includes a plurality of said deposit spaces;

said one of a wetting inhibiting and a non-wettable surface of said substrate and said template is in contact with said solder material in said deposit spaces;

said fusing forms a plurality of moldings of solder in a form a plurality of solder balls;

removing said template from said substrate;

providing another substrate with one of a wetting inhibiting and a non-wettable substrate surface;

placing said template on said another substrate to position said deposit space over said substrate surface of said another substrate.

10. The process in accordance with claim 8, wherein:

said solder material is filled into said deposit space in a form of one of a pasty and particulate material.

11. The process in accordance with claim 8, wherein:

said solder material takes a form of a mixture of a liquid, an organic medium and solder particles.

12. The process in accordance with claim 8, wherein:

said filling of said solder material into said deposit space includes applying said solder material to said template in a molten mass under a liquid level of an organic medium.

13. The process in accordance with claim 12, wherein:

said filling of said solder material includes cooling said substrate to promote said filling.

14. The process in accordance with claim 8, wherein:

said filling of said solder material includes arranging said solder material on a surface of said template and displacing said solder material using a displacement device.

* * * * *